(12) United States Patent
Ogura

(10) Patent No.: US 8,530,933 B2
(45) Date of Patent: Sep. 10, 2013

(54) PHOTO TRANSISTOR

(75) Inventor: Mutsuo Ogura, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 274 days.

(21) Appl. No.: 12/998,343

(22) PCT Filed: Oct. 6, 2009

(86) PCT No.: PCT/JP2009/067689
§ 371 (c)(1),
(2), (4) Date: Apr. 18, 2011

(87) PCT Pub. No.: WO2010/041756
PCT Pub. Date: Apr. 15, 2010

(65) Prior Publication Data
US 2011/0193133 A1  Aug. 11, 2011

(30) Foreign Application Priority Data

Oct. 10, 2008  (JP) ................................. 2008-264251
Mar. 26, 2009  (JP) ................................. 2009-075596

(51) Int. Cl.
*H01L 31/072* (2012.01)

(52) U.S. Cl.
USPC .... 257/187; 257/184; 257/198; 257/E31.067; 257/E29.033

(58) Field of Classification Search
USPC ........... 257/184, 187, 198, E31.067, E29.033
See application file for complete search history.

(56) References Cited

U.S. PATENT DOCUMENTS 4,806,997 A * 2/1989 Simmons et al. ............. 327/512
4,887,138 A   12/1989 Gardner
(Continued)

FOREIGN PATENT DOCUMENTS

JP  S60-213067  10/1985
JP  S61-280665  12/1986
(Continued)

OTHER PUBLICATIONS

Japanese Journal of Applied Physics; vol. 28, No. 10, Oct. 1989, pp. 1843-1846; Wide-Wavelength InGaAs/InP PIN Photodiodes Sensitive from 0.7 to 1.6 μm, Kagawa et al.

(Continued)

*Primary Examiner* — Allan R Wilson
(74) *Attorney, Agent, or Firm* — Manabu Kanesaka

(57) ABSTRACT

A highly sensitive and wide spectra-range mesa type photodetector having the impurity diffusion along the mesa-sidewall is provided. A mesa-type hetero-bipolar phototransistor or photodiode having a photo-absorption layer formed by a first semiconductor layer of a first conductivity type, an anode layer (or base layer) formed by a second semiconductor layer of a second conductivity type which has an opposite polarity with the first conductivity type, a wide band gap emitter or window layer formed by the third semiconductor layer on the anode layer, and the wide band gap buffer layer of the first conductivity type which has a relatively wide band gap semiconductor as compared with the second semiconductor layer on the substrate, which also serves as the cathode layer. And the first semiconductor layer, the second semiconductor layer and the wide band gap emitter or window layer is selectively etched to form the mesa structure. The diffusion region shaped like a ring in plan view is also provided from the exposed sidewall of this mesa structure toward the center of the device by a predetermined horizontal width, converted into the second conductivity type, which is the same conductivity type as the second semiconductor layer.

5 Claims, 5 Drawing Sheets

(56) References Cited

U.S. PATENT DOCUMENTS

| | | | |
|---|---|---|---|
| 4,904,608 A | 2/1990 | Gentner et al. | |
| 4,996,166 A * | 2/1991 | Ohshima | 438/317 |
| 6,479,844 B2 * | 11/2002 | Taylor | 257/192 |
| 7,067,853 B1 | 6/2006 | Yao | |
| 7,247,892 B2 * | 7/2007 | Taylor | 257/197 |
| 8,415,713 B2 * | 4/2013 | Ogura | 257/187 |
| 2002/0121647 A1 * | 9/2002 | Taylor | 257/192 |
| 2011/0001166 A1 * | 1/2011 | Ogura | 257/187 |

FOREIGN PATENT DOCUMENTS

| | | |
|---|---|---|
| JP | S62-139354 | 6/1987 |
| JP | S62-141769 | 6/1987 |
| JP | S62-141770 | 6/1987 |
| JP | S63-227053 | 9/1988 |
| JP | H05-291605 | 11/1993 |
| JP | 2005-166837 | 6/2005 |

OTHER PUBLICATIONS

IEEE Transactions on Electron Devices, vol. 52, No. 2, Feb. 2005; Characterization and Modeling of Three-Terminal Heterojunction Phototransistors using an InGaP Layer for Passibation; Tan et al.

High Gain and Wide Dynamic Range Punchthrouph Heterojunction phototransistors. Downloaded Jun. 21, 2008, Wang et al. J.Appl Phys vol. 74 No. 11, p. 6978-6981.

Japanese Journeal of Applied Physics, vol. 29, No. 5, May 1990, pp. 810-812; Segregation of Zinc in InGaAs/InP heterostructures During Diffusion: Experiment and Numerical Modeling; Dildey et al.

Jpn. j. Appl. Phys. vol. 33 (1994) pp. 5774-5778; Part 1, No. 10, Oct. 1994; Zn-Diffusion-Induced Disordering of InGAAs/AlGaInAs Multiple Quantum well and its Application to Long-Wavelength laser, Goto et al.

* cited by examiner

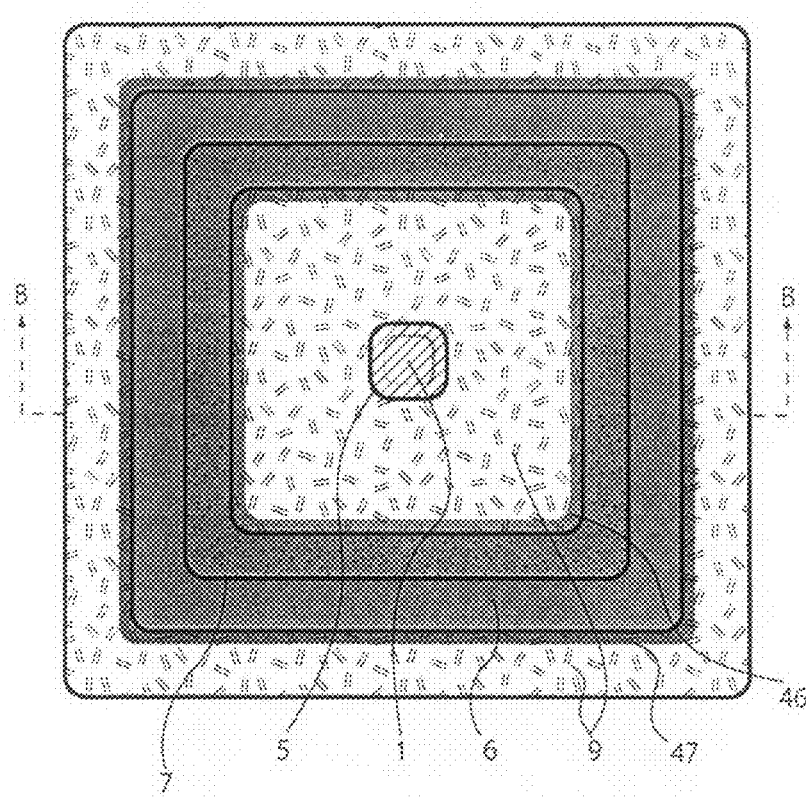
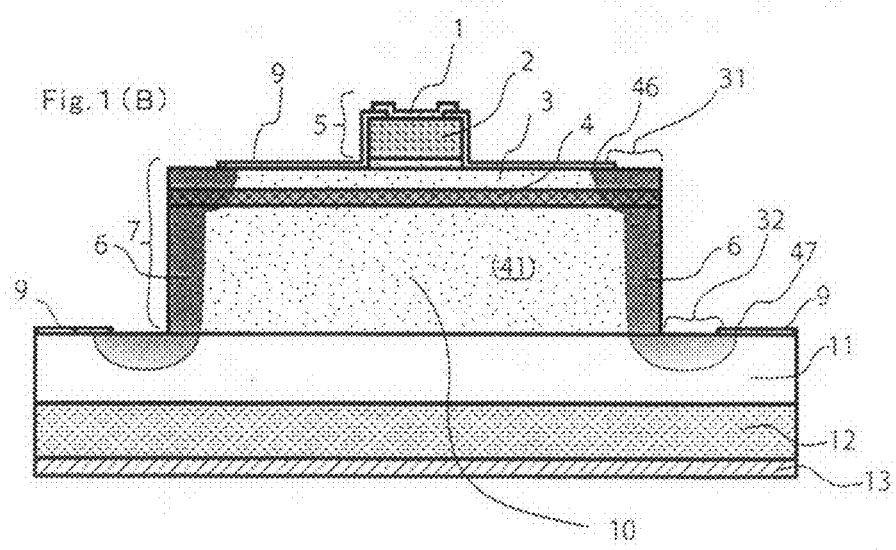
Fig.1(A)
Fig.1(B)

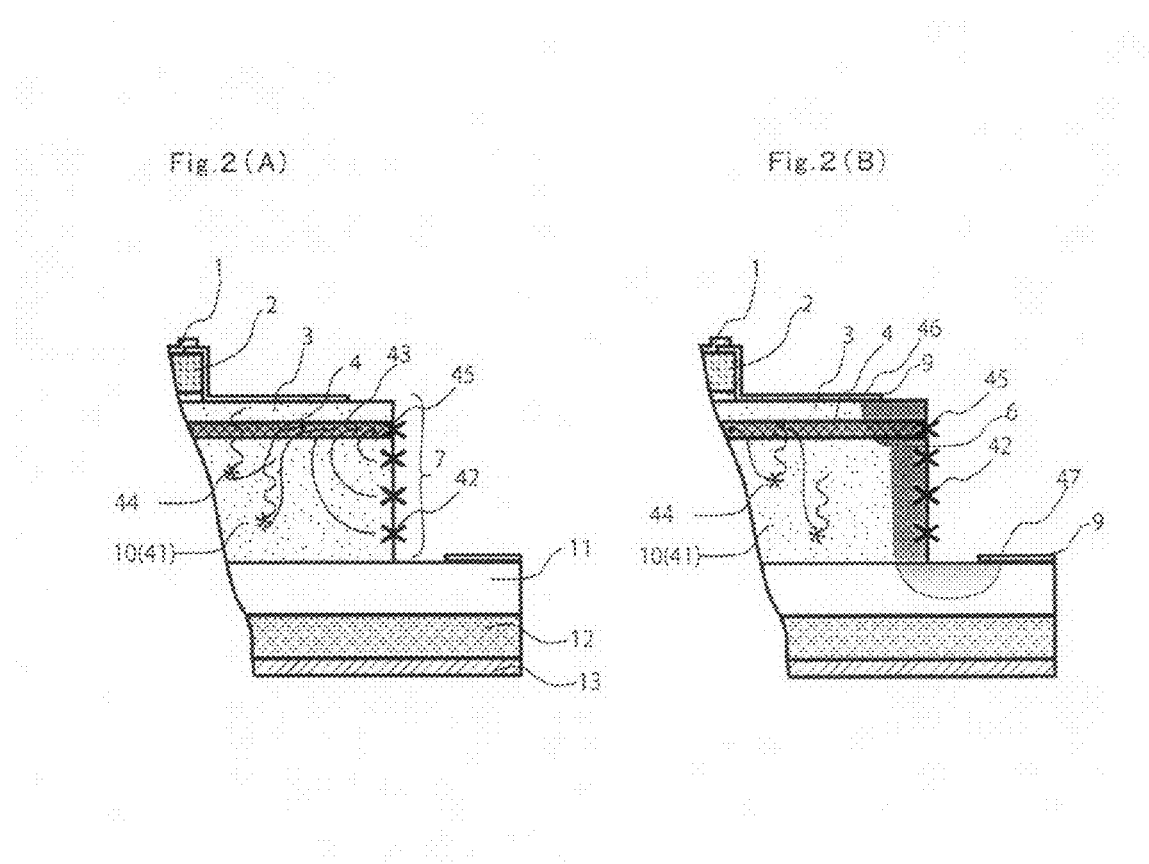

PHOTO TRANSISTOR

RELATED APPLICATIONS

The present application is National Phase of International Application No. PCT/JP2009/067689 filed Oct. 6, 2009, and claim priority from Japanese Applications No. 2008-264251, filed Oct. 10, 2008 and No. 2009-075596, filed Mar. 25, 2009, the disclosure of which are hereby incorporated by reference herein in its entirety.

TECHNICAL FIELD

This invention relates to a photo detection device, or a photodetector and more particularly to the improvement of a photodiode (PD) and a hetero-junction bipolar phototransistor (HPT) comprised of a compound semiconductor material system.

BACKGROUND ART

Photodetectors and one or two dimensional arrays of the photodetectors comprised of a compound semiconductor material system have sensitivity in the near ultraviolet and the infrared regions that silicon detectors don't cover. They are in broad demand in fields such as sensing devices for optical communications and spectroscopic systems, or as infrared cameras for medical treatment, disaster prevention, industrial inspection, and others.

A photodiode, which has semiconductor P-N junction, is simple in its operating principle and excellent at quantitative performance, however, it produces very small current output for weak incident light, since only one pair of electron and hole is generated with one photon at most. Therefore, detection limit is determined by the noise characteristics of an external electric amplifier. Therefore, phototransistors having an internal amplification function have been developed also as compound semiconductor photodetectors. Even in a photodiode, demand on its excellent performance is still highly demanded, as it is easy to operate due to its 2 terminal device characteristics.

The performance of a photodiode is characterized by the detectable wavelength range, the quantum efficiency determined by the photo-induced carrier per photon, the dark current which determines the noise level, and the response speed, and the cross talk between adjacent elements when an array is constructed. Various improvements have been made on each of them so far.

A photodiode has two structure types. The one is a mesa structure in which a P-N junction is formed beforehand by crystal growth, and then, a photodiode element is formed by etching in the shape of an island. The other is a planar structure in which impurities are selectively doped in the depth direction from the surface of an n-type epitaxial layer to invert to the p-type, where the n layer is used as the cathode layer and the p layer is used as the anode layer. Although the mesa structure has an advantage in reducing a device size and floating capacitance, which is suitable for obtaining high-speed response, there is an issue of large surface leak current (dark current) generated at the P-N junction exposed on the sidewall of the island mesa structure. On the other hand, the planar structure has an advantage of suppressing the surface leak current, since the P-N junction including an optical absorption layer is not exposed to the surface. However, it also has large disadvantage, for example, additional processes are required for isolating adjacent elements adequately when an array is constructed, and it may become disadvantageous in manufacturing process in many cases.

In general, the crystal surface has large crystal defect density compared with the inside of the crystal. Therefore, the recombination and generation current becomes serious in case when the optical absorption layer with a narrow band gap is exposed to the surface and kept under the depletion condition. Then, dark current can be suppressed by the selective diffusion of impurities from the cap layer with a wide energy band gap, which forms the P-N junction on the surface in the wide energy band gap semiconductor.

According to this knowledge, as mentioned in the following document 1, there was an invention to suppress the dark current also in the photodiode which has a mesa structure. That is, after preparing the epitaxial structure where a photo-absorption layer with a narrow band gap is sandwiched by semiconductor layers with a wide energy band gap and forming a mesa structure, the whole mesa region and the mesa bottom of the semiconductor layer with a large band gap are selectively doped with impurities.

Document 1: U.S. Pat. No. 4,904,608.

On the other hand, in order to improve the quantum efficiency and the detectable wavelength range, it is effective to prepare a P-N junction at the shallow position in the depth direction from the surface. This is because light is substantially absorbed in the surface layer for the short wavelength light with energy higher than the band gap of the photo-absorption layer. And light-excited electron hole pairs cannot reach to the depletion layer which generates photo-induced current, if the P-N junction is located at a deep position. For example, in the case of a planar type PD, though it is not a mesa structure, the following document 2 discloses an attempt of setting the junction depth at about 0.3 μm deep by shortening the Zn diffusion time and extending the detection wavelength to the short wavelength side up to 0.7 μm. On the other hand, in the following document 3, although the P-N junction is formed at a shallow position by Be ion implantation, dark current is comparatively large caused by crystal defects created by high energy ion implantation.

Document 2: Shuzo Kagawa, etc. "Wide-Wavelength InGaAs/InP PIN photodiodes Sensitive from 0.7 to 1.6 μm", Japanese Journal of Applied Physics 28 (1989) pp. 1843-1846.

Document 3: U.S. Pat. No. 4,887,138.

In contrast to such photodiodes, the heterojunction bipolar phototransistor (HPT) is highly advantageous for obtaining higher sensitivity and has lower noise characteristics than the avalanche photodiode (APD) which also has the amplification function of photoelectric current. Therefore, HPTs have been continuously studied until now since the 1980s. However, in the HPT, the effect of the recombination current generated between the emitter and the base junction becomes prominent in the low illumination range which results in low emitter current, and reduces the current gain at the low collector current conditions. Moreover, the dark current generated in the reversely biased base collector junction drifts to the base layer and is amplified same as the photo-induced current so that the dark current becomes the source of noise and reduces the sensitivity of photodetection.

Therefore, suppressing the recombination current between the emitter and the base, and the generation current between the emitter and the collector are important for realizing a highly sensitive HPT. Regarding the suppression of the recombination current between the emitter and the base, the improvement technique taken for the heterojunction bipolar transistor (HBT) aiming at amplification of electric signals can be applied effectively. For example, in the following documents 4 and 5, such technologies are disclosed that the surface recombination of carriers is suppressed by regrowth of a highly resistive or thin p-type semiconductor at the sidewall of the emitter and base region of the HBT formed in ridge geometry. Especially, when the regrowth layer is made with a wide energy band gap semiconductor as a so-called embedded structure, a barrier can be formed, which prevents minority carriers to move toward the surface. However, only with these techniques disclosed by documents 4 and 5, crystal defects are created in the regrown interface due to oxidization or disorder of stoichiometry at the sidewall of the mesa structure formed by etching. And they become major source of surface recombination current or ohmic current. This regrowth method is generally better than the dielectric passivation; however, it has not brought the best result yet.

Document 4: JP-A 1987-141769.

Document 5: JP-A 1987-141770.

In addition, as disclosed in the following documents 6 for example, there is the technology of diffusing Zn from the emitter surface to reach to the base layer aiming to lower the external base resistance. The contact resistance between the base electrode and the intrinsic base layer inside of the device tends to be high since the base layer is thin. This is called "Craft Base Structure" nowadays and it became a common knowledge. According to such a structure as stated also in the following document 7, carrier recombination at the exposed sidewall of the base is suppressed, and an improvement of current gain is recognized as the base emitter junction exposed on the ridge sidewall has moved to the inside of the device.

Document 6: JP-A 1986-280665.

Document 7: JP-A 1987-139354.

Furthermore, not for the HBT but especially for the HPT, in order to enhance the transistor amplification function for very weak incident light, it is reported in the following document 8 that the recombination of photo-generated charges at the surface of the base region is suppressed and an improvement in the transistor characteristic is recognized by protecting the surface (which intersects the sidewall perpendicularly and parallel to the main surface of substrate) with the wide band gap emitter rather than exposing the narrow gap base, as a photosensitive layer upward to the surface.

Document 8: Shin-Wei Tan, etc. "Characterization and Modeling of Three-Terminal Heterojunction Phototransistors Using and InGaP Layer for Passivation", IEEE Transactions on Electron Devices, Vol. 52, No. 2, pp. 204-210, February 2005.

As stated in the following document 9, the structure called "Punch Through HPT" is proposed which sets the base region depleted by lowering the base carrier concentration and it produces about 10 times higher sensitivity compared to a conventional HPT mode. This is owing to the effect that influence of the recombination current between the emitter and the base is reduced by maintaining the emitter idling current without base bias current, and that the base potential can be lowered with small photo-generated charges, which is brought by the fact and the emitter-base and the base-collector junction capacitances are decreased.

Document 9: Y. Wang, etc. "High gain and wide dynamic range puch-through heterojunction phototransistors", J. Appl. Phys. 74 (11) pp. 6987-6981, December 1993.

On the other hand, the argument from another viewpoint is made in the following document 10. That is, in the physical measurement by a discrete element or one-dimensional array, it takes about 1 second for a human to recognize the data, and as for an image sensor, a frame rate is at most about 1/30 seconds in the case of video imaging. Therefore, it may be more desirable to be able to integrate light signal from several milliseconds to several seconds. Concerning the applications for physics and chemistry measurements or enhancement of infrared camera sensitivity, it is said that it is not always necessary to take an operation speed into consideration.

In HBTs, it is important to reduce the base resistance in order to improve the frequency characteristic, and the base carrier concentration is usually set to the order of $10^{19}$ cm$^{-3}$. However, the minority carrier recombination rate increases in the base region with the high base doping concentration, and the low frequency gain of a transistor is rather deteriorated.

Thus, in the usual HBT, the high frequency characteristic becomes the most important issue, and the base layer is formed thin, and the carrier concentration is set high in order to reduce the base resistance. While in the HPT photodetector array for obtaining a higher sensitivity, the base concentration of the order of $10^{17}$ cm$^{-3}$ can be said to be advantageous from the view point of crystal quality.

Document 10: U.S. Pat. No. 7,067,853

In order to obtain an efficient photo-response to the wavelength shorter than the band gap energy, generally, it is necessary to form a P-N junction at shallowest possible depth. This is to make the incident light penetrate and generate the electron and hole pairs within the minority carrier diffusion length from the P-N junction. Moreover, since the surface recombination effect is large on the device surface, it is effective to cover the device surface with the wide band gap semiconductor which has a low recombination rate.

By using a wide band gap semiconductor as a window, the electron and hole pairs, which are generated inside the photoabsorption layer of the narrowband gap semiconductor, are prevented from moving to the surface, and recombination of the electron and hole pairs can be suppressed.

For example, in the case of the heterojunction having an InP as a wide band gap semiconductor and InGaAs as a narrow band gap semiconductor, the ratio of a short wavelength light reaching to the InGaAs through the InP is estimated. The required design condition is $\alpha(\lambda)L<1$, where L is the thickness of InP, and $\alpha(\lambda)$ is the absorption coefficient for the detection wavelength $\lambda$. For example, the optical absorption coefficient of the InP at the wavelength at $\lambda$=0.6 µm is $6.42 \times 10^4$ cm$^{-1}$ so that the thickness to make a L=1 is 156 nm. The optical absorption coefficient of InP at $\lambda$=0.5 µm is $1.09 \times 10^5$ cm$^{-1}$ so that the thickness to make $\alpha L$=1 is 92 nm, similarly 18 nm at $\lambda$=0.4 µm.

However, the idea of increasing the detectable wavelength range was not well considered for the structures such as abovementioned conventional planar type PIN photodiodes or the mesa type PIN photodiodes disclosed in the above documents. Usually selective diffusion of Zn was carried out all over the light receiving area through a comparatively thick n-InP layer. This is because the surface (the light receiving surface) where Zn diffusion was carried out has a high Zn concentration and a lot of surface defects, and the minority carrier life becomes short. Therefore, the P-N junction where photo carriers are generated was necessary to form enough space from the surface in order to obtain an efficient photodiode. Another reason for the deep Zn diffusion depth is to make the reverse breakdown voltage higher by increasing the radius of curvature and reducing the electric field intensity of the diffused front edge. It is also favorable to ensure the electric conductivity of the surface.

Furthermore, it is necessary to perform a diffusion process at relatively high temperature (500-600 degrees C.) in order to ensure the repeatability of Zn diffusion conditions and suppress the generation of crystal defects. To ensure the repeatability of the diffusion conditions, it is necessary to perform diffusion for at least 10 minutes by taking the heat up time of a sample into consideration. In the above condition, the diffusion depth resulted in about 0.5 in the case of InP, and about 0.2 μm in InGaAs. It is difficult, therefore, to form the P-N junction using a thinner InP than this by the Zn diffusion through the whole light receiving surface to the depth direction. In the case of thin InP, the effect of Zn accumulation in the InP-InGaAs hetero interface is recognized, which in turn makes the precise control of doping concentration profile difficult as stated in the following document 11.

Document 11: F. Dildey, etc. "Segregation of Zinc in InGaAs/ InP Heterostructures During Diffusion: Experiment and Numerical Modeling", Japanese Journal of Applied Physics vol. 29, No. 5 (1990) pp. 810-812.

In other words, in the conventional planar type PDs or the PDs disclosed by the abovementioned document 1, the specified wavelength range could not be extended enough to the short wavelength side, since to form the P-N junction in a very shallow depth position was not well considered or difficult. In the abovementioned document 2, although the location of the P-N junction is set to about 0.3 μm in the depth direction, it is not shallow enough for the required wavelength range. As stated in the abovementioned document 3, when a P-N junction is formed at a shallow depth position by the ion implantation of Be, the leakage current increases about one hundred times compared to a Zn-diffused planar type PIN diode due to the crystal defects created by the ion-implantation as already stated.

In general, in the case of the PIN photodiode with an InP/InGaAs system, it is desirable to form a p-type InGaAs and an n-type InGaAs layer, both with low impurity concentration of comparatively long minority carrier lifetime under a thin p-type InP cap layer in order to obtain high quantum efficiency and wide wavelength spectra range, where the thickness of the p-type InGaAs layer should be less than the sum of the minority carrier diffusion length of the p-type InGaAs layer and a depletion layer width of about 1 μm. This structure is easily realized with the metal organic chemical vapor deposition (MOCVD) or the molecular beam epitaxy (MBE). In this case, mesa etching is necessary to remove the surface p-type layer to isolate the devices since the P-N junction is formed all over the wafer parallel to the principal surface of the substrate. In the case of the HPT instead of the PD, a device isolation is needed by mesa etching after growing a base layer of a p-type narrow band gap semiconductor sandwiched by an emitter layer of a n-type wide band gap semiconductor and a collector layer of a n-type wide band gap semiconductor epitaxially. However, even if the device isolation is done comparatively easily, it induces increase of the leakage current since the sidewall of the P-N junction is exposed after mesa etching. This issue must be solved.

Generally sources of the dark current are the current generation resulting from crystal defects, the thermally excited current corresponding to the band gap energy, and electric field induced current components such as avalanche effect. As for the site of the dark current generated in the photodetector, there are two sources, the bulk component generated inside of the device and the surface component generated on the surface of the device. The main factors of the bulk component are the generation current resulting from crystal defects and the thermally excited current corresponding to the band gap energy. Therefore, the reduction of the bulk dark current is rather difficult as it is uniquely determined by the physical properties and crystalline quality of the materials to be used. In addition to the improvement of the crystalline quality in general, the suppression of dark current has been performed by cooling a photodetector, so far.

On the other hand, the surface dark current component has the generation and recombination current at the surface, and the leakage current of ohmic nature.

As the HPT structures mentioned above or the conventional photo FET structures having a mesa structure where a semiconductor material exposes to the sidewall, the crystal surface conditions are greatly affected by the manufacturing skills such as etching and passivation technology. In other words, the surface dark current resulting from the generation and recombination current, and the ohmic leakage current are largely dependent on the manufacturing process. This causes the deterioration and non-uniformity of the device characteristics, which results in lowering the manufacturing yield.

Moreover, when a device structure has an acute-angle shape, the dark current is affected by the punch-through phenomenon due to amplification of electric field or by electric field induced avalanche effect. Since the crystalline conditions of the surface is easily affected in case of a narrow band-gap material, the longer the detectable wavelength of the photodetector, the more serious the effect of the crystal surface on the dark current.

According to the well known SRH (Shockley-Read-Hall) statistics, electron and hole pairs are generated when the product of the electron and hole concentration are smaller than that of the thermal equilibrium condition, and in the contrary, electronic hole pairs recombine when the product of the electron and hole concentration are larger than that of the thermal equilibrium condition. Moreover, in the case of depletion condition, the carrier generation rate becomes higher in the narrow band-gap semiconductor with larger intrinsic carrier concentration $n_i$. In case of the P-N junction of a mesa structure, most part of the electron hole pairs are generated at the surface defects in the exposed device side surface particularly in the narrow band-gap materials under the depletion condition. The holes generated in this exposed side surface are led to the anode, and becomes the dark current component. In case of the HPT, dark current occurs in the exposed side surface of the depleted collector region, and holes disappear in the side surface of the base region which reduces the current amplification factor $\beta$.

Moreover, when providing the abovementioned punch-through type HPT or improving the current amplification factor beta by blocking holes and leading electrons to the collector layer smoothly, it requires precisely controlled band-gap profiles or the base layer with comparatively low carrier concentration by fine epitaxial techniques. However, the Zn diffusion and ion implantation techniques which are generally performed as the traditional impurity doping method can possibly disturb not only carrier concentration but also material composition profiles as stated in the following document 12 is employed.

Document 12: K. Goto, "Zn-Diffusion-Induced Disordering of InGaAs/AlGaInAs Multiple Quantum Well and Its Application to Long-wavelength Laser", Japanese Journal of Applied Phys. Vol. 33 (1994) pp. 5774-5778.

Incorporating various knowledge mentioned above, this invention has its object to solve or ease the defects resided in the above-mentioned conventional devices. This invention provides photodetectors having structurally advantageous mesa structure particularly of HPT composed with compound semiconductor materials, which are built with an effective surface current blocking structure (SCB) and designed not to serve the surface region as a current path in order to suppress the dark current caused by generation and recombination current at the surface. Therefore, the photodetectors provided with this invention have higher sensitivity and wider wavelength range than conventional devices.

DISCLOSURE OF THE INVENTION

In order to realize the abovementioned purpose, the present invention proposes the followings when the PD is provided as a photodetector:

a photo-absorption layer formed by the first semiconductor layer of the first conductivity type, and an anode layer on the first semiconductor layer formed by the second semiconductor layer of the second conductivity type which is reversed polarity with the first conductivity type, and a wide band gap buffer layer of the first conductivity type which has a relatively wide band gap semiconductor as compared with these first and second semiconductor layers formed under the first semiconductor layer, a substrate which is under this wide band gap buffer layer and serves as the cathode layer;

the first and second semiconductor layers being stacked and formed in an island shape mesa structure by mesa etching, wherein the mesa having a photodiode structure of which sidewall is exposed to space;

a diffusion region of which the shape looks like a ring in planar view is also provided from the exposed sidewall of this mesa structure toward the center of the device by a predetermined horizontal width, converted into the above second conductivity type, which is the same conductivity type as the second semiconductor layer;

a part of the anode layer surface parallel to the substrate principal plane, being diffused from the sidewall to the inside of the device with a predetermined width in the horizontal direction;

and the wide band gap buffer layer surface parallel to the substrate principal plane being diffused with the second conductivity type and with a predetermined width in the horizontal direction from a region contacted to the mesa.

When the present invention is applied to a suitable structure to form the HPT, it comprised the followings;

a collector layer of the first semiconductor layer with the first conductivity type;

a base layer of the second semiconductor layer, formed on said first semiconductor layer and having the second conductivity type opposite to the first conductivity type;

an emitter layer of the third semiconductor layer formed on said second semiconductor layer having the first conductivity type and a band gap larger than that of the second semiconductor layer;

a buffer layer formed under the first semiconductor layer has a band gap wider than said first semiconductor layer, a substrate located under the wide band gap buffer layer; wherein said the first, second, and third semiconductor layers are stacked and formed in the mesa structure with an island shape by mesa etching, and have a heterojunction bipolar phototransistor structure with the mesa side surface exposed to outside;

a diffused region like a ring shape in the planar view being converted by impurity diffusion from the exposed sidewall of this mesa structure to the inside of the device with a predetermined width in the horizontal direction into said second conductivity type, having the same conductivity type as said second semiconductor layer;

a part of the emitter surface parallel to the substrate principal plane having a diffused region with said second conductivity type and with a predetermined width in the horizontal direction from the sidewall;

a part of the wide band gap buffer layer surface parallel to the substrate principal plane having a diffused region with the second conductivity type and with a predetermined width in the horizontal direction from a region contacting the mesa to outside.

Furthermore, a specific embodiment of this invention is the HPT where an emitter contact layer is formed on said emitter layer; and an additional diffusion region is formed piercing through said emitter layer along the perimeter part of said emitter in a closed ring shape without contacting said emitter contact layer.

EFFECT OF INVENTION

In the photodetector having the mesa structure formed according to this invention, either formed as a PD or an HPT, the P-N junction with the ring shaped diffusion region along the mesa sidewall has an effect to be set back inside the device equivalently. In other words, this invention brings an effect equal to eliminate the crystal defects around a P-N junction exposed to a mesa surface. Because of this reason, dark current can be suppressed very effectively and also the thickness of the layer located above the photo-absorption layer can be made thinner without difficulty because dopant impurities do not spread over the photo-acceptance surface. Being combined with these improvements, the photodetector formed by this invention can be highly sensitive and have wider wavelength range compared with conventional devices.

Moreover, according to the specific embodiment of the present invention of the HPT having an additional ring shape diffusion region piercing from the top of an emitter layer to the bottom of the emitter layer, an active transistor region can be reduced so that substantial improvement in gain and frequency characteristics can be obtained.

BRIEF DESCRIPTION OF THE DRAWINGS

FIG. 1(A) illustrates a plan view of the HPT as a preferred embodiment of this invention.

FIG. 1(B) is a cross-sectional view along the B-B line in FIG. 1(A).

FIG. 2(A) is an explanatory illustration explaining defects in the conventional HPT.

FIG. 2(B) is an explanatory illustration showing the improved part in the HPT produced according to this invention.

BEST MODE FOR CARRYING OUT THE INVENTION

Figure 3:
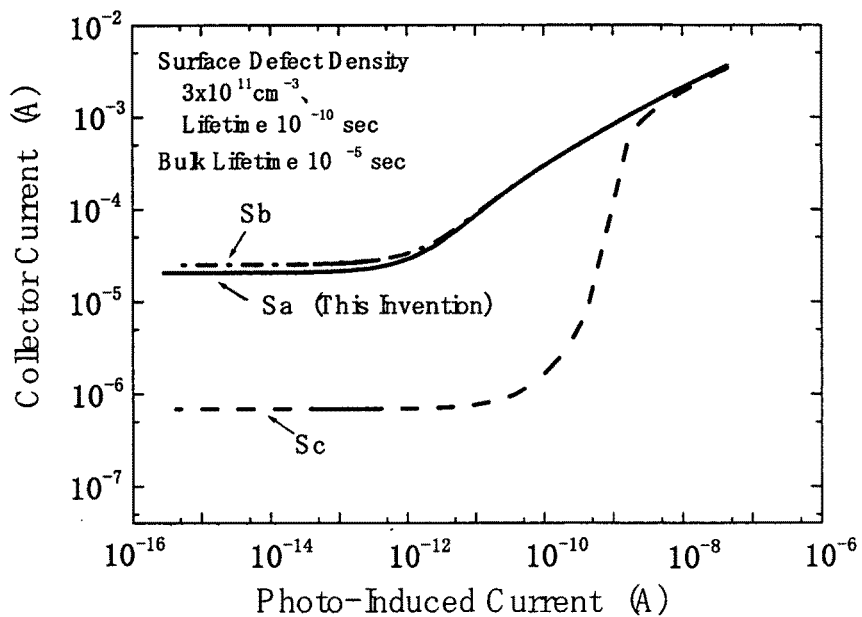
FIG. 3 shows simulated characteristics of the collector current and the photo induced current relationship brought by an example of the HPT produced according to this invention.

Preferred embodiments of the present invention are provided in FIG. 1 and following figures. Through all the figures, the same symbol and numbering correspond to the same or similar parts. Therefore, in each explanation along with each figure among this patent description, when there are no description of the components with symbols in the figure, the description of the components with the same symbols provided in the other figures may be used alternatively.

Although the photodetectors to be improved by this invention are PD and HPT, here first of all, in respect with HPT, one desirable embodiment, which was applied this invention, we would like to explain along with FIGS. 1(A) and 1(B).

FIG. 1(A) illustrates a plan view of the HPT as a preferred embodiment of this invention. FIG. 1(B) illustrates the cross-sectional view along the B-B line in FIG. 1(A).

Upon a collector layer 10 as the first semiconductor layer and having a first conductivity type, for example, n-type conductivity, the base layer 4 as the second semiconductor layer and having a second conductivity type with a polarity opposite to the first conductivity type, for example, p-type conductivity is stacked. Upon the base layer 4, an emitter layer 3 composed of wider energy band gap semiconductor compared with the base layer 4 and having the first conductivity type, that is, n-type conductivity in this case is stacked as the third semiconductor layer. An emitter electrode 1 is formed above the emitter layer 3 via an emitter contact layer 2 with high doping concentration. On the other hand, a buffer layer 11 is located under the collector 10 of the first semiconductor layer, which has n-type conductivity of the first conductivity type and has a band gap wider than the collector 10, and formed on the substrate 12. The collector electrode 13 contacts the back side of the substrate 12.

The collector layer 10, the base layer 4, and the emitter layer 3, which are laminated in the order from the substrate side to the upper side is formed in a mesa structure 7 with an island shape by mesa etching. Therefore, the sidewall of the mesa island becomes a surface entirely exposed outside along its periphery. The emitter contact layer 2 on the emitter layer 3 is also cut out by mesa etching as the second mesa structure 5, which has a smaller area than the main mesa structure 7, and is located at the center part of the device.

According to this invention, the diffused region 6 converted into the semiconductor layer of the second conductivity type, which is, the same conductivity type as the base layer 4, is formed by using predetermined dopant with a predetermined width in the horizontal direction from the exposed sidewall of the mesa structure 7 toward the center of the device. For example, by performing thermal diffusion of dopant such as zinc (Zn), it is possible to convert only the surficial part (a part with a laterally diffused distance) of the predetermined width from the exposed sidewall of the emitter layer 3 and the collector layer 10 in the horizontal direction inside, into the p-type semiconductor which is the same conductivity type as the base layer 4, i.e., the second conductivity type. Also a part of the surface exposed above the emitter layer 3 parallel to the substrate principal surface becomes a Zn diffused region 31 with the second conductivity type with a predetermined width in the horizontal direction toward the center of the device from the sidewall, and similarly the surface part of the buffer layer 11 located under the collector layer 10, parallel to the substrate principal surface becomes a Zn diffused region 32 with the second conductivity type and with a predetermined width 32 in the horizontal direction from the part which contacts the mesa structure 7 toward the outside in the horizontal direction. Thus, in the above-mentioned structure, the P-N junctions 46 and 47 exposed to the device surface are to be formed both on the wide band gap energy semiconductors in which the effect of the crystal defects is relatively small. In addition, when the impurity diffusion is employed, it is desirable to extend the diffusion front to the inner side of the SiN diffusion mask 9 with a predetermined opening pattern which exposes the perimeter of the mesa structure 7.

In the HPT of this embodiment, the region 41 of the collector layer 10 becomes the photo-absorption layer (photo-sensitive region) 41 located under the surface area between the p-type diffused region 6 formed as mentioned above and the mesa structure 5 of the emitter contact layer. The Zn diffused region 6 is formed in a ring shape in plan view as it is formed in the entire circumference along the exposed sidewall of the mesa structure 7. In other words, when taking a cross section parallel to the substrate 12 at any height of the mesa structure 7, the ring shape diffused region 6 is found there. Therefore, if only the diffused region 6 is extracted from the part of this mesa structure 7 in three dimensions, it looks like a hollow cylindrical body. From such a view, the diffused region 32 formed on the surface of the buffer layer 11 parallel to the substrate principal surface and located under the collector layer 10, and contacting with the mesa structure 7, can be said as a configuration like a flange formed as to protrude horizontally from the lower end of this hollow cylindrical body. However, as it is indicated in FIG. 1 (A), since the mesa structure 7 is rectangular shape in a plan view in this embodiment, it is not the circular shape of a ring but the rectangle ring shape. In other words, the terminology "Ring Shape" in this invention means a configuration which is closed round along a device sidewall, and does not have any shape-specific meaning of no matter whether it is circular or rectangular substantially.

No matter which it is, in the HPT of this embodiment according to this invention, unlike a conventional example exhibited in the above-mentioned document 1, the Zn diffused region 6 is formed only at the sidewall of the mesa structure 7, while bulk region of the collector layer 10 used as a photo-absorption layer of the photodetector is not affected by the Zn diffusion. This diffused region 6, as an original structure provided with this invention, together with the other diffused regions 31 and 32, can be called a SCB (Surface Current Block) region. And according to the scheme of this invention, it becomes possible to control the film thickness, composition, and doping profile in a nanometer scale using high precision epitaxial growth technology provided by the existing MOCVD or MBE.

Moreover, according to this invention, the sufficient suppression effect of dark current can be expected with the abovementioned structure as shown in FIG. 2 (A) and (B). Then, as shown in FIG. 2 (A), when a conventional HPT structure formed without the diffused region 6 upon this invention is considered, the exposed sidewall of the mesa structure 7 in the conventional HPT is being depleted near a base-collector P-N junction by applying reverse bias to the collector layer. Therefore, crystal defects 42 generated at an exposed sidewall of a mesa structure 7 cause a large dark current under a depletion conditions because they are crystal defects existing in a narrow band gap semiconductor and act as active minority carrier generation sources. On the other hand, crystal defects 45 generated at an exposed sidewall of an emitter base junction, accelerate the minority carrier recombination and reduce the current amplification factor β because the minority carrier is usually excessive as it is forward biased.

In addition, the hole current generated by optical illumination 44 is schematically shown by the sign 43 in FIG. 2 (A) and (B) for reference.

As opposed to this, in the HPT provided by this invention which can be called as the SCB-HPT since it has the SCB region as the original scheme of this invention, an exposed sidewall of a P-N junction is converted into a singular conductivity type with high impurity concentration by injection of the predetermined dopant as shown in FIG. 2 (B) so that a P-N junction effectively is set back to the inside of the device (inside of the collector layer 10, the photo-absorption layer 41), and terminated at the surface 46 of the emitter layer 3 with a wide band-gap energy, and at the surface 47 of the wide band gap energy buffer layer 11.

As the depletion layer or minority carrier accumulation layer does not exist at the exposed sidewall of a mesa structure covered by the high-concentration p-type semiconductor layer, a thermal equilibrium state is maintained there. Therefore, the minority carrier generation or the minority carrier recombination at the exposed sidewall of this mesa structure 7 is suppressed even if crystal defects with high concentration exist there, and it is effectively the same as though the crystal defects disappeared virtually. Moreover, since the P-N junctions formed after introducing the dopant at the surface 46 of the intrinsic emitter and the surface 47 of the wide band gap buffer layer has a wide band gap energy semiconductor, it brings an equivalent effect that $n_t$ in the abovementioned SRH statistics becomes small, and dark current at the surfaces is effectively suppressed.

In FIG. 3, simulation results on the relation between collector current and the photo induced current generated in the photosensitive region 41 are shown for the InGaAs/InP SCB-HPTs implemented by this invention together with the conventional HPT for comparison. The emitter contact layer 2 is n-InGaAs (graded from $10^{19}$ cm$^{-3}$ to $10^{16}$ cm$^{-3}$ and 0.4 μm thickness), the emitter layer 3 is n-InP ($10^{16}$ cm$^{-3}$ and 0.2 μm thickness), the base layer 4 is p-InGaAs ($2\times10^{17}$ cm$^{-3}$ and 0.1 μm thickness), the collector layer 10 is n-InGaAs ($10^{15}$ cm$^{-3}$ and 1.5 μm thickness), the buffer layer 11 is n-InP ($5\times10^{15}$ cm$^{-3}$ and 0.5 μm thickness), respectively. The diameter of the second mesa structure 5 of the emitter contact layer part is 4 μm, and the diameter of the mesa structure 7 is 24 μm. For reference, the smaller the dimension of the second mesa structure 5, obviously, the larger the light receiving area becomes.

The simulations assumed $10^{-5}$ sec for the carrier lifetime inside the semiconductor, $3\times10^{11}$ cm$^{-3}$ for the trap density in the semiconductor surface, $10^{-10}$ sec for the carrier lifetime related to the semiconductor surface defects, and surface defects are assumed as donor type with the energy level of 0.35 eV from the conduction band. Parameters related to the crystal defects inside of the crystal and surfaces are set up to reproduce the experimental value of the dark current of a planar type and a ridge type PIN photo diode both having an InGaAs/InP material system. P-type impurity is diffused from the opening of the diffusion mask 9, and the surface concentration of the diffused region 6 is set to $10^{19}$ cm$^{-3}$, and the impurity profile in the depth direction is assumed to be a gaussian distribution with the standard deviation of $\sqrt{2}\times0.2$ μm. The base layer 4 has no electrode, and the emitter electrode 1 is set to ground potential, and 2V is applied to the collector electrode 13.

In FIG. 3, the curve Sa shown with the solid line is an HPT having an SCB region formed according to this invention, the curve Sb shown with a dashed dotted line is a conventional mesa type HPT without Zn diffusion and without surface defect levels, which is ideal but not realistic. The curve Sc shown with a dashed line is a conventional mesa type HPT without Zn diffusion and having surface defect levels that are expected usually in a mesa type HPT. In the comparatively ideal curve Sb, the collector current is constant at 25 μA and there is no photo-response until the photo induced current is increased to about 0.1 μA. Upon photo-induced current of pA order is induced in the photosensitive layer 41, the collector current of μA order is detected as an increment. As opposed to this, in the curve Sc, the collector current is suppressed in a low illumination range (i.e. the region where the photo induced current is small), and the collector current increases rapidly after the photo induced current reaches 100 pA order. That is, traps existing on the semiconductor surface decreases light sensitivity by double digits. As explained along with FIG. 2(A), holes generated by light illumination in the collector layer 10, or the photo-absorption layer 41, drift and are injected in the base layer 4 and majority of them in the base layer 4 recombine with electrons supplied by surface traps on the surface part 46 of the mesa perimeter under low illumination condition, and disappear so that photo-generated holes do not contribute to increase the base potential.

On the other hand, by doping Zn from the exposed sidewall according to this invention, the surface part 46 of the mesa structure 7 as well as the diffused region 6 are inverted to p-type only with the predetermined width 31 shown in FIG. 1(B), and as shown in the curve Sa, pA order of photo induced current is converted into collector current comparable to that can be obtained in an ideal structure without surface defects.

As the result of shifting the P-N junction inside of the device by Zn diffusion, even if the collector electrode 12 is positively biased against the emitter electrode 1, thermal equilibrium is maintained even in the perimeter of crystal defects 42 in the exposed sidewall of the collector layer 10 and the defects 45 at the exposed sidewall of the base layer 4, and carrier accumulation or depletion condition are ceased to be formed. That is, in the photo detector wherein holes accumulates in the base layer like the HPT structure, the metallurgical P-N junction formed in the narrow band-gap semiconductor material exposed at the sidewall of the mesa disappears from the surface and new P-N junctions emerge at the surface of the wide band-gap semiconductor materials by converting the region of the P-N junction exposed by the mesa structure 7 into p-type with a predetermined width. And dissipation of holes in the base layer exposed to the sidewall can be suppressed.

In the embodiment shown in FIG. 1, the mesa structure 7 is formed to the depth of the InP buffer layer 11, and the diffused region 6 is formed in the exposed sidewall of the collector layer 10 and the surface part 47 of the InP buffer layer 11 with the predetermined width 32 as shown in FIG. 1(B). Thus, P-N junction exposed to the surface is formed only in InP having a wide band-gap energy so that this configuration bring an effect of reducing the influence of surface defects, and an additional effect of reducing cross talk between elements when plural HPT elements are laid out in an array.

Figure 4:
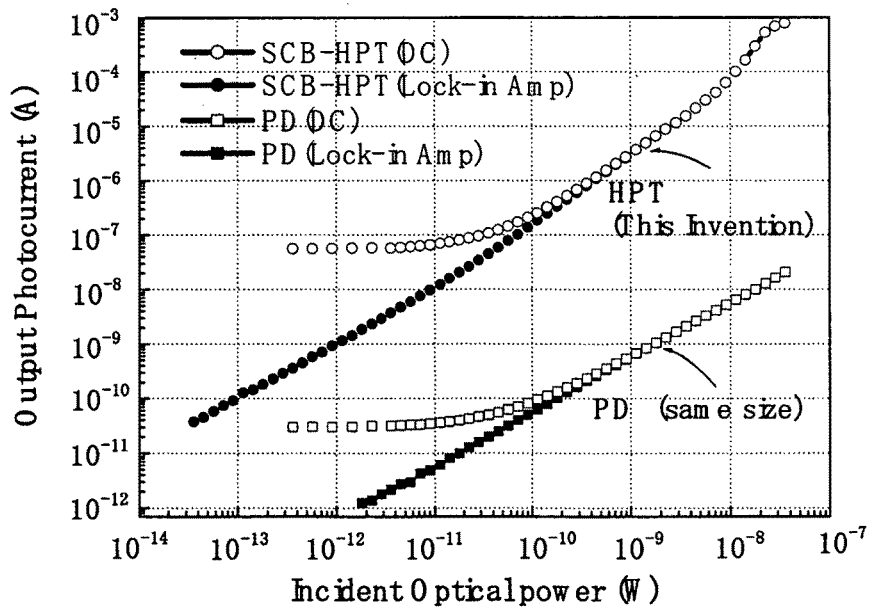
FIG. 4 shows characteristics of the optical input and output currents relation exhibited by an example of the HPT produced according to this invention, comparing an example of the conventional PD.

FIG. 4 compares the sensitivity characteristics of the HPT (SBC-HPT) having the SCB region produced according to the present invention, with that of a conventional photo-diode (PD) of the same size with the HPT.

In this figure, white circles indicate measured DC optical response of the HPT of the present invention, black circles indicate measured lock in amplifier output of optical response, white squares indicate measured DC output of the conventional PD, and black squares indicate measured lock in amplifier output. The HPT according to this invention exhibits 1,000 to 10,000 times of the PIN photo diode output depending on an input light intensity level. Therefore, the influence of an external amplifier noise can be greatly reduced since the equivalent input noise of an external amplifier converted to the light input intensity at the photodetector is equivalent to the external amplifier noise divided by the gain of the HPT. In fact, as shown in FIG. 4 where the SCB-HPT and the conventional PD of the same size are compared, the detection limit of the PD is 1 pico-watt for incident light intensity, while, detection limit of the HPT of the present invention is several tens femto-watts, and improvement of several tens times in the detection limit is recognized for an usual measurement environment. Furthermore, in the HPT formed according to the present invention, it has succeeded in obtaining 20 kA/W at the peak wavelength sensitivity of 1.5 μm, and maintaining the sensitivity of 10 kA/W even in 0.4 μm. Thus, this invention exhibits to be able to make a great contribution to construct an optical detection system with high sensitivity from visible to infrared wavelength range.

Figure 5A:
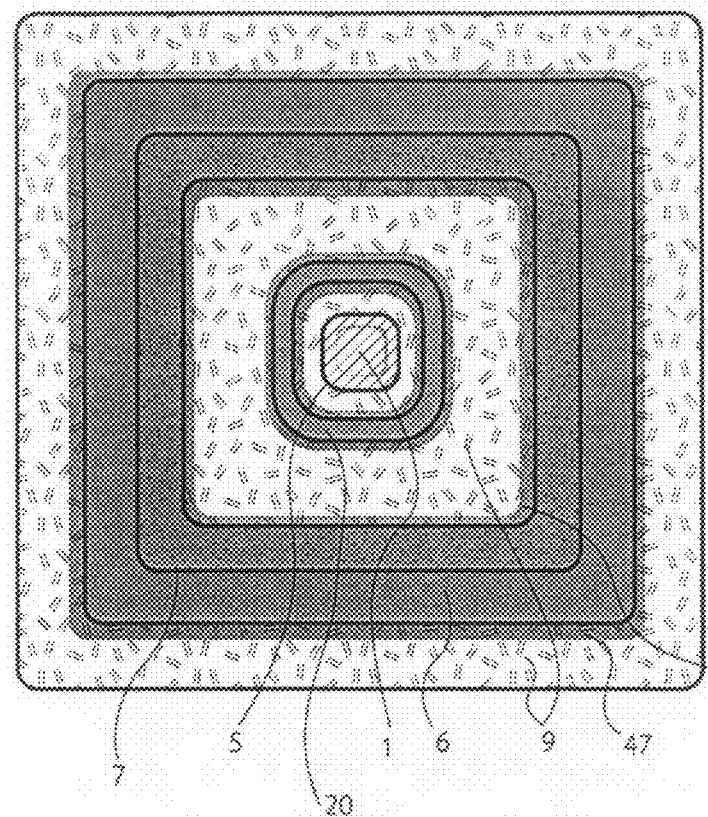
FIG. 5(A) illustrates a plan view of the HPT as a preferred second embodiment of this invention.
Figure 5B:
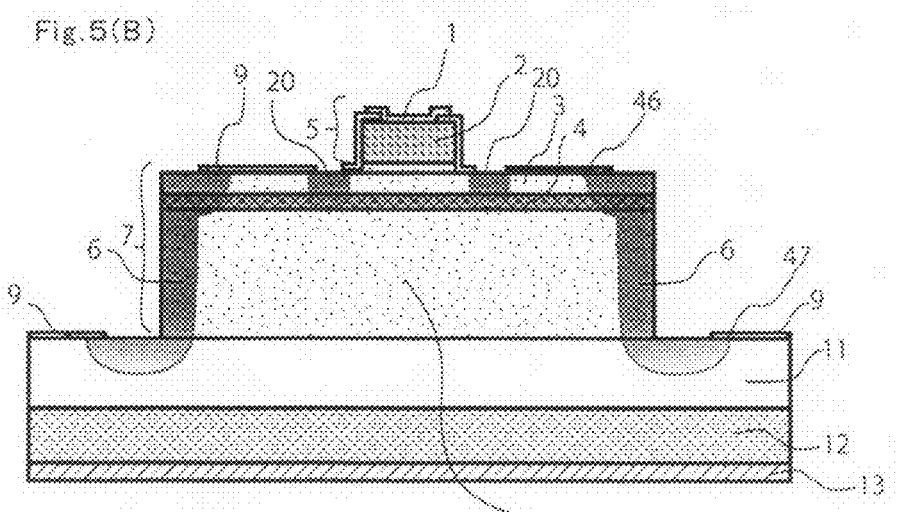
FIG. 5(B) is a cross-sectional view along the B-B line in FIG. 5(A).

An HPT as the second embodiment of this invention is shown in FIGS. 5(A) and 5(B). As parts that are not explained herein, same compositions as the HPT shown in FIG. 1 are applied and parts added in the second embodiment are explained mainly as follows:

In this embodiment, the emitter contact layer 2 is required to set position of the following additionally diffused region 20. And, an additional diffused region 20 with a ring shape in the direction of the periphery is formed in plan view along its perimeter part through the opening in the mask 9 without contacting this emitter contact layer 2 and in the emitter layer 3 below it. This diffused region 20 is the same conductive type with the diffused region 6, and pierces through the emitter layer 3 vertically. When focusing on this diffused region 20 only, it looks like a form of a hollow cylindrical object, and a part of the emitter layer remaining inside becomes an active emitter region.

By doing this way, gain and frequency characteristics of the HPT can be improved. That is, electron current injected into the intrinsic emitter layer (for example, an n-InP intrinsic emitter layer) 3 from the emitter contact layer (for example, n+-InGaAs emitter contact layer) 2, is blocked by a potential barrier built by the emitter layer part (for example, the diffused region 20 of InP) which is converted into the second conductive type (for example, p-type) mentioned already, and emitter electron current concentrates in the substantial emitter region which is the inner area surrounded by the ring shape diffused region 20. Therefore, the effective transistor size shrinks and the electron current density increases. The frequency response is improved as the effective transistor size shrinks. Moreover, in the hetero-bipolar transistor, when the emitter current density is increased to a certain extent, the effect of the recombination current in the base or the base emitter interface becomes small, and the current gain increases. Therefore, the current gain in the low illumination conditions can be improved by reducing the effective transistor size.

Figure 6A:
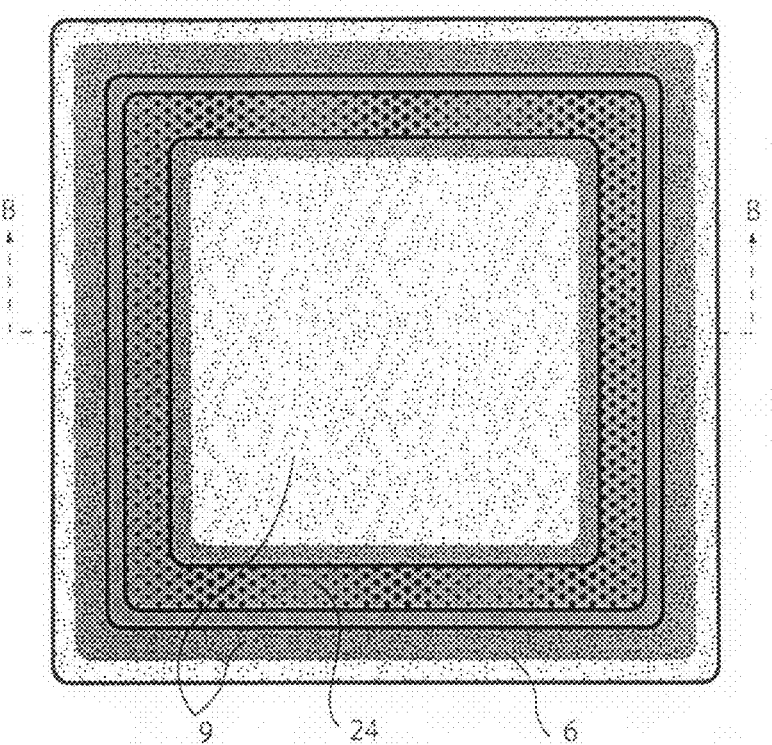
FIG. 6(A) illustrates a plan view of the PD as one example of further embodiment of this invention.
Figure 6B:
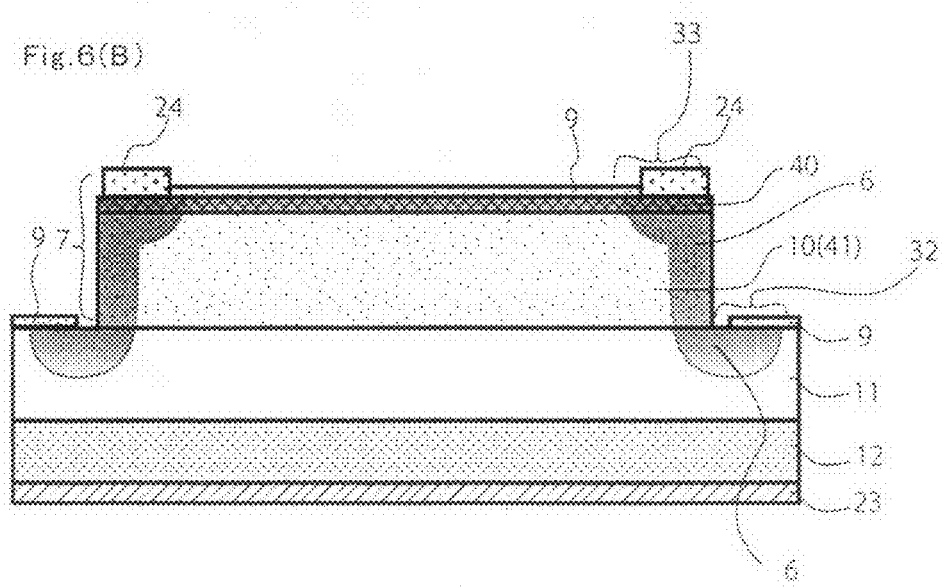
FIG. 6(B) illustrates the cross-sectional view along the B-B line in FIG. 6 (A).

The above explains about the present invention taken for the embodiment applied to the HPT. In a sense, it can of course apply the present invention to the PD as a more fundamental structure, and the same effect can be acquired as already explained. FIGS. 6(A) and 6(B) show one desirable embodiment which formed a PD according to the present invention.

FIG. 6(A) is the plan view of the concerned PD, and FIG. 6(B) is the cross-sectional end view along the line B-B in FIG. 6(A).

First, the first semiconductor layer 10 of the first conductive type compound semiconductor, n-type for example, is the photo-absorption layer 41 in this embodiment, and above this, the anode layer 4 of the second semiconductor layer with the second conductive type compound semiconductor, p-type, for example, which is the reverse polarity with the first conductive type, is laminated. Under the photo-absorption layer 41 which is the first semiconductor layer 10, the first conductive type, therefore, the wide band gap energy buffer layer 11 are formed which contains a relatively wide band gap energy compound semiconductor as compared with the first semiconductor layer 10 of a n-type in this case. This is formed on the substrate 12 which serves as a cathode layer, and the cathode electrode 23 contacts the back side of the substrate 12

In the order from the substrate side to the upper part, the photo-absorption layer 10 is placed underneath the anode layer 40. They form the mesa structure 7 cut out in an island shape by mesa etching. Therefore, their sidewall is exposed outside entirely along its periphery. The anode electrode 24 is formed in a ring shape along the sidewall of the anode layer 40. The definition of the words and phrases "ring-shape" is as already mentioned.

According to this invention, the diffused region 6 converted into the semiconductor layer of the second conductivity type, which is the same conductivity type as the anode layer 40, is formed by using a predetermined dopant with a predetermined width in the horizontal direction from the exposed sidewall of the mesa structure 7 toward the center of the device. The diffused region 6 is formed like a ring shape at the plan view. As the same as the previous example, it is just to perform thermal diffusion of the dopants, such as Zn, and it is possible to convert into the p-type semiconductor of the same conductive type as the anode layer 40, only by the thickness part (lateral diffusion depth) of the predetermined dimension from the exposed sidewall of the photo-absorption layer 10 (41) to the horizontally inner direction. Moreover, the diffused region 33 is formed also in the flat surface of the anode layer 40 parallel to a substrate principal surface toward center of the device from a sidewall by the predetermined horizontal direction dimension, and also the diffused region 32 of the second conductive type is formed by the Zn diffusion in the surface part parallel to the substrate principal surface of the buffer layer 11 located under the photo-absorption layer 41 which is the first semiconductor layer 10. Thus, the P-N junction in the device surface is to be formed both on a wide band gap energy semiconductor where the effect of crystal defects is not serious.

With the planar type PIN photo diode by the conventional Zn diffusion, the surface concentration of Zn amounts to $10^{20}$ $cm^{-3}$, and in order to reduce the internal crystal defect density or to reduce the internal electric field intensity, it is necessary to form a graded the carrier concentration profile in the P-N junction. Therefore, with the conventional planar type photo diode, it was obliged to perform rather deep selective Zn diffusion into comparatively thick n-InP layer of about 0.5-1 μm in the shape of an island, in order to withstand the adequate reverse bias voltage and ensure the low dark current characteristics. This causes InGaAs, which is used as the photo-absorption layer, to be placed far from the surface in the depth direction, and there is a disadvantage that its sensibility falls at the wavelength shorter than 0.9 μm, which is absorbed by InP. On the other hand, with the PIN photo diode which has the conventional mesa structure, it was also possible to have sensibility at the short wavelength by making the surface p-InP layer thin, but the surface leak current in the exposed sidewall has not been suppressed.

Contrary, in the PD according to this invention, the exposed sidewall of the P-N junction of the mesa structure which includes the photo-absorption layer 41 (10) and the p-InP anode layer 40 of n-InGaAs, for example, is inverted to a p-type in a ring shape by Zn diffusion. Since the P-N junction comprised with narrow band-gap semiconductor is set back toward the inside of the device, the influence of leakage current can be suppressed. Moreover, the thinning of the anode layer 40 becomes possible because Zn has not been diffused at the photo-acceptance surface. That is, the PD according to the invention can efficiently absorb the wavelength of the concern by setting the layer thickness below the inverse of the optical absorption constant of the wavelength, while, it has not been able to make it so thin due to the various conventional restrictions. According to this invention, such restrictions are released substantially, and it is also possible to freely set the thickness from 100-200 nm or less in general, and it is possible to attain much wider spectra-range compared to the conventional products.

Moreover, when PD is arranged in the shape of an array, since the photo-absorption layer 41 is common to each array component in the conventional planar type PD array, the cross talk between the array components becomes a problem due to the inter-mixing of the photo-generated carriers generated in the adjacent elements. On the other hand, since the photo-absorption layer 41 is isolated from the substrate for every array element in this invention, the cross talk can be secured to be 20 dB or more, and the dark current is as good as that of the conventional planar type PDs.

In addition, although this is the knowledge acquired experimentally, when forming the mesa structure in a rectangle island shape in a plan view as shown in the figure, it turns out that it is possible to reduce the electric field concentration in the corner sections by setting the curvature of the corner at 3-5 μm. Moreover, the anode electrode 24 is formed on the surface of the anode layer 40, which is the second semiconductor layer 4 in the figure, but it can also be formed to contact the diffused region 32 on the wide band gap buffer layer 11, which was inverted to p-type by the impurity diffusion according to this invention.

The invention claimed is:

1. A photo-transistor comprising:
   a collector layer formed of a first semiconductor layer with a first conductivity type;
   a base layer formed of a second semiconductor layer with a second conductivity type opposite to the first conductivity type and disposed on the first semiconductor layer;
   an emitter layer formed of a third semiconductor layer and disposed on the second semiconductor layer, the emitter layer having the first conductivity type and a band gap wider than that of the second semiconductor layer;
   a wide band gap buffer layer with the first conductivity type formed under the first semiconductor layer, and having a band gap wider than that of the first semiconductor layer; and
   a substrate located under the wide band gap buffer layer;
   wherein the first, second, and third semiconductor layers stacked together have a mesa structure with an island shape by mesa etching, the mesa structure having a heterojunction bipolar phototransistor structure with a mesa side surface exposed to outside; and
   wherein the photo-transistor further comprises:
   a diffusion region having a ring shape in a top view, and converted into the second conductivity type which is a same conductivity type as the second semiconductor layer, the diffusion region having a predetermined width in a horizontal direction from the exposed sidewall of said mesa structure to an inside thereof;
   another diffusion region formed of the second conductivity type, located at a part of the emitter surface parallel to a substrate principal plane, and extending from the sidewall to an inside thereof with a predetermined width in the horizontal direction; and
   a further-diffusion region formed of the second conductivity type, located at a part of the wide band gap buffer layer surface parallel to the substrate principal plane, and extending from a region contacting the mesa structure toward outside in a predetermined width in the horizontal direction.

2. A photo-transistor according to claim 1, wherein an emitter contact layer is formed on the emitter layer; and
   an additional diffusion region is formed to extend through the emitter layer along a perimeter part of the emitter contact layer in a closed ring shape without contacting the emitter contact layer.

3. A photo-transistor according to claim 1, further comprising an emitter contact layer deposited on the emitter layer, and an emitter electrode deposited on the emitter contact layer.

4. A photo-transistor according to claim 1, further comprising a first diffusion mask disposed on the buffer layer spaced from the photo-absorption layer, and a second diffusion mask disposed on the emitter layer and the emitter contact layer.

5. A photo-transistor according to claim 4, wherein said second diffusion mask includes an outer edge spaced from an outer edge of the emitter layer, and an inner edge located between the emitter contact layer and a part of the emitter electrode, the second diffusion mask covering a side of the emitter contact layer.

* * * * *